United States Patent [19]
Adlam et al.

[11] Patent Number: 5,861,076
[45] Date of Patent: Jan. 19, 1999

[54] METHOD FOR MAKING MULTI-LAYER CIRCUIT BOARDS

[75] Inventors: Edwin J. Adlam, Singapore, Singapore; Sukianto Rusli, Chandler, Ariz.; Jordan L. Wahl, Mesa, Ariz.; Tayfun Ilercil, Phoenix, Ariz.; Robert A. Forcier, Mesa, Ariz.; Jerome S. Sallo, Scottsdale, Ariz.

[73] Assignee: Park Electrochemical Corporation, Lake Success, N.Y.

[21] Appl. No.: 524,182

[22] Filed: Sep. 6, 1995

Related U.S. Application Data

[63] Continuation of Ser. No. 213,172, Mar. 14, 1994, abandoned, which is a continuation-in-part of Ser. No. 004,621, Jan. 14, 1993, abandoned, which is a continuation of Ser. No. 732,215, Jul. 19, 1991, abandoned.

[51] Int. Cl.$^6$ .................................................. B32B 31/00
[52] U.S. Cl. .................. 156/281; 148/272; 156/308.8; 156/3.9; 174/259; 252/188.21; 427/98; 427/305; 427/343; 427/437; 428/626; 428/637; 428/687
[58] Field of Search ..................................... 156/281, 319, 156/308.8; 427/98, 305, 343, 437; 252/188.21; 174/259; 148/272; 428/626, 637, 687

[56] References Cited

U.S. PATENT DOCUMENTS 2,364,993 12/1944 Meyer.
2,460,896 2/1949 Meyer.

(List continued on next page.)

FOREIGN PATENT DOCUMENTS 0 035 406 9/1991 European Pat. Off..
2 586 035 2/1987 France.
56-153797 11/1981 Japan.

OTHER PUBLICATIONS

"reagent Chemical,"7th Ed., American Chemical Society; Washington, DC, 1989, pp. 604–5, 628–31, 636, and 637.
Chenghuan Che, et al. (1988) *Puretingu to Kotingu*, vol. 8(1),pp. 49–56.
Weil, E.D. in "Kirk–Othmer's Concise Encylopedia of Chemical Technology," Wiley–Interscience; New York, 1985, p. 1134.
Weil, E.D. in "Kirk–Othmer's Encyclopedia of Chemistry," 3rd Ed., vol. 22, Wiley–Interscience; New York, 1984, pp. 135–151 and 154–167.
Swaine, J.W. in "Kirk–Othmer's Encyclopedia of Chemistry," 3rd Ed., vol. 22, Wiley–Interscience; New York, 1984, pp. 975–989.
G.W. Heunisch, *Inorg. Chem.*, vol. 16, No. 6, pp. 1411–1413 (1977).
"Encyclopedia of Electrochemistry of the Elements", A.J. Bard, ed.; Marcel Dekker: NY, 1975, 1975, vol. 4.

*Primary Examiner*—John J. Gallagher
*Attorney, Agent, or Firm*—Darby & Darby

[57] ABSTRACT

The present invention relates to a bond enhancement process for promoting strong, stable adhesive bonds between surfaces of copper foil and adjacent resin impregnated substrates or superimposed metallic sublayers. According to the process of the invention, a black oxide-coated copper surface is treated with an aqueous reducing solution containing sodium metabisulfite and sodium sulfide to convert the black oxide coating to a roughened metallic copper coating. The roughened metallic copper-coated surface is then passivated and laminated to a resin impregnated substrate. The bond enhancement process is especially useful in multilayer printed circuit fabrication and in the treatment of copper circuit lines and areas which are disconnected from each other, that is, which do not have electrically conductive continuity. Inner-layer laminates prepared according to the process of the invention are not susceptible to pink-ring formation, exhibit excellent resistance to chemical attack at drilled holes and sheared edges and are stable under thermal and mechanical stresses.

39 Claims, 5 Drawing Sheets

U.S. PATENT DOCUMENTS

| | | |
|---|---|---|
| 2,643,199 | 6/1953 | Hersch . |
| 2,955,974 | 10/1960 | Allen et al. . |
| 3,177,103 | 4/1965 | Tally et al. . |
| 3,198,672 | 8/1965 | De Hart . |
| 3,240,662 | 3/1966 | Smyers et al. . |
| 3,293,109 | 12/1966 | Luce et al. . |
| 3,374,129 | 3/1968 | Boucher . |
| 3,425,947 | 2/1969 | Rausch et al. . |
| 3,434,889 | 3/1969 | Haroldson et al. . |
| 3,481,777 | 12/1969 | Spannhake . |
| 3,544,389 | 12/1970 | Vazirani et al. . |
| 3,585,010 | 6/1971 | Luce et al. . |
| 3,677,828 | 7/1972 | Caule et al. . |
| 3,728,178 | 4/1973 | Caule et al. . |
| 3,940,303 | 2/1976 | Caule et al. . |
| 3,944,449 | 3/1976 | Caule . |
| 3,984,598 | 10/1976 | Sarazin et al. . |
| 4,336,028 | 6/1982 | Tomibe et al. . |
| 4,364,739 | 12/1982 | Tomibe et al. . |
| 4,378,226 | 3/1983 | Tomibe et al. . |
| 4,409,037 | 10/1983 | Landau . |
| 4,410,593 | 10/1983 | Tomibe et al. . |
| 4,642,161 | 2/1987 | Akahoshi et al. . |
| 4,661,417 | 4/1987 | Suzki et al. . |
| 4,775,444 | 10/1988 | Cordani . |
| 4,784,910 | 11/1988 | Nagai et al. . |
| 4,844,981 | 7/1989 | Landau . |
| 4,997,516 | 3/1991 | Adler . |
| 4,997,722 | 3/1991 | Adler . |

METHOD FOR MAKING MULTI-LAYER CIRCUIT BOARDS

This is a continuation of application Ser. No. 08/213,172, filed Mar. 14, 1994, which is a continuation-in-part of application Ser. No. 08/004,621, filed Jan. 14, 1993, which is a continuation of application Ser. No. 07/732,215, filed Jul. 19, 1991, all now abandoned.

This invention relates to a process for promoting adhesion between the surface of a copper foil or sheet and an adjacent resin impregnated substrate. The process of the invention is also useful in preventing the so-called pink-ring effect in the vicinity of holes which extend through two or more layers of a multilayer printed circuit board.

BACKGROUND OF THE INVENTION

Printed circuit (or wiring) boards are well known in the electronics field. In general, such boards consist of a dielectric resin impregnated substrate (e.g. of woven or non-woven glass fibers) that is adhered to a sheet or foil of conductive metal, generally copper, on at least one surface. Typical resins that can be used to impregnate the substrate include phenolic resins, epoxy resins, polyimides, polyesters and the like. The copper sheet or foil is joined to the semi-cured resin impregnated substrate using well known techniques, e.g. by application of heat and pressure.

Thereafter, electrical circuit patterns are formed on the copper layers by conventional techniques. For example, a layer of photoresist may be coated over the copper layer, exposed imagewise and developed to yield a relief resist image on the copper layer. The exposed copper is etched away and the resist image is removed, leaving the copper circuit pattern exposed. Elemental copper, like other pure metals, generally exhibits poor adhesion characteristics for bonding to dielectric resinous substrates typically used in circuit board manufacture, and intermediate conversion coatings are frequently helpful to enhance the adhesion of the metal to the substrate. Hence, the copper foil may be treated prior to being laminated to the resin substrate to form a layer of copper oxide, tin or other adhesion promoter on at least one surface. Various methods have been employed for this purpose. Examples of such methods are described in U.S. Pat. Nos. 2,955,974; 3,177,103; and 3,198,672.

Printed circuit boards prepared as described above may be assembled to form multilayer printed circuit board constructions by stacking a predetermined number of boards one atop another. In such a construction, the cured or semi-cured polymeric non-conductive materials (such as epoxy resin impregnated fiberglass cloth) is in contact with the copper surface of the adjacent circuit board. The stacked circuit board assembly may be laminated together by application of heat and pressure to form a multilayer printed circuit board.

Typical laminating conditions involve pressing the stacked boards between metallic plates at a pressure between about 200 psi to about 600 psi at a temperature of between about 150° C. to 205° C. for up to about 4 hours. The electrical circuit patterns on the outer layers may then be interconnected to the circuit patterns on the inner layers by drilling an array of holes through the multilayer assembly circuit boards. The through-holes in the assembled boards are then cleaned by treatment with dilute solutions of strong acids and the like. Thereafter, the through-holes may be plated with copper to render the sides of the holes conductive thereby completing the circuit between the outer layer and the inner layer circuit patterns.

Black copper oxide (CuO) coatings have been employed for a number of years to promote adhesion between the etched copper circuit patterns and intermediate polymeric dielectric layers of multilayer boards. In general, such coatings are prepared by oxidizing the exposed surface of the copper with an oxidizing agent. However, problems with this approach have prompted a search for improved coatings. In particular, total or local delamination of the copper circuit pattern layer from the polymeric layer may occur due to poor adhesion and/or the tendency of the copper oxide layer to dissolve upon exposure to acidic solutions employed in subsequent treatment of the multilayer board. The combination of poor adhesion and susceptibility of the copper oxide to dissolution upon exposure to such solutions is known as the "pink-ring" or "halo" effect.

The pink-ring effect occurs primarily in the vicinity of the circuit through-holes that pass through two or more layers of a multilayer printed circuit board assembly. These so-called "through-holes" are subsequently made conductive by plating with copper metal or filling with solder to become part of the electrical circuit constructed on the printed circuit boards. Prior to the plating or soldering operation, but subsequent to lamination and drilling, the through-holes are cleaned to remove debris from drilling (e.g. resin smear) with a cleansing solution comprising a dilute aqueous solution of a strong acid (e.g. sulfuric acid, hydrofluoric acid, chromic acid and the like). This cleansing operation tends to cause dissolution of the copper oxide coating exposed by the through-holes. This can later result in delamination or loss of adhesion between adjacent metal and plastic layers in the vicinity of the through-holes. Upon close inspection, a pink-ring appears to be formed in the area around the hole. Appearance of this pink-ring phenomenon is believed to be evidence of delamination of the metal/plastic layer in the printed circuit board in which such effect is observed.

A number of approaches to solving the problem of pink-ring have been tried. For example, thicker coatings of copper oxide have been deposited on the exposed copper surface to retard the dissolution process by sheer volume of the copper oxide remaining after dissolution (see for example U.S. Pat. Nos. 2,955,974; 3,177,103; and 4,409,037). However, the thicker coatings result in poor initial adhesion between the coated metal and resinous substrate even before the cleansing solution is applied, and therefore do not solve the problem resulting from the pink-ring effect. Another approach has been to use a coating of tin in place of the copper oxide layer as an adhesion promoter. However, the level of adhesion achieved with this technique has not been sufficient to overcome the problem (U.S. Pat. Nos. 4,732,649 and 4,775,444).

Other approaches to solving the problem of pink-ring include methods of treating copper oxide-coated copper surfaces to promote adhesion between said copper surfaces and resin impregnated substrates. U.S. Pat. Nos. 4,661,417; 3,585,010; and 3,293,109 disclose methods to electrolytically reduce copper oxide coated surfaces to metallic copper or electrolytically deposit copper metal onto metallic copper surfaces prior to joining such surfaces to plastic substrates. These electrolytic methods, however, are not useful in printed circuit boards having disconnected elements, i.e. circuits that are not electrically connected to one another since the disconnected elements cannot be electrically connected to an electrical power source as required in performing an electrolytic reduction.

A variety of reducing agents known in the art, e.g. formaldehyde, sodium hypophosphite, hydrazine and the like, can reduce cupric compounds in aqueous solution to metallic copper. Such reductants are used for metallizing plastic surfaces and either do not appreciably reduce surface copper oxide to metallic copper or result in the formation of a powdery copper surface (see U.S. Pat. No. 4,642,161 for a general discussion of reducing agent limitations). For example, U.S. Pat. No. 4,642,161 discloses a method of reducing copper oxide coatings to metallic copper using reducing solutions containing simple amine boranes. However, treatment of copper oxide surfaces with amine boranes has been determined to produce powdery copper coatings that are unacceptable for use in electrical circuit boards.

U.S. Pat. No. 4,997,516 discloses a method for reducing copper oxide coatings to metallic copper using an alkaline reducing solution containing sodium dithionite and polymeric addition agents such as gelatin and glue. However, treatment of copper oxide surfaces with sodium dithionite produces a mass of metallic copper whiskers by a primary reduction process and amorphous cuprous oxide which quickly converts to copper powder in a concurrent secondary reduction process. The copper powder cannot be separated from the copper whiskers and a significant amount of secondary reduction must be interrupted by rapid treatment of the copper surface with an acid-salt wash to dissolve the cuprous oxide and thus prevent formation of copper powder. This method is impractical because the timing of the acid-salt wash must be carefully balanced between allowing sufficient reduction of black oxide to metallic whiskers and preventing secondary formation of substantial amounts of copper powder.

Despite these efforts, a simple, cost-effective process which promotes strong adhesion between adjacent copper foils and polymeric substrates which imparts superior mechanical, thermal and electrical properties and avoids the delamination and loss of adhesion attendant to the so-called pink-ring effect has not been available until the advent of the present invention.

OBJECTS OF THE INVENTION

It is an object of the present invention to provide a process for firmly bonding surfaces of copper sheets or foils to adjacent polymeric substrates.

Another object of the present invention is to provide a bond enhancement process useful for the fabrication of multilayer printed circuit boards having improved adhesion between, and greater resistance to delamination of, the interior metal and resin impregnated substrate layers of the multilayer assembly.

A further object of the invention is to provide multilayer printed circuit boards which are not susceptible to pink-ring formation, exhibit excellent resistance to chemical attack at drilled holes and sheared edges and are stable under thermal and mechanical stresses.

These other objects of the present invention will become apparent from the detailed description of the invention set forth below.

SUMMARY OF THE INVENTION

The present invention involves a bond enhancement process useful for constructing multilayer printed circuit board assemblies and for enhancing the adhesion between adjacent layers of metal and resin impregnated substrate. According to the invention, at least one exposed metal surface of a copper metal sheet or foil, which may already be laminated on the side opposite the exposed side to an underlying reinforced resin substrate, is oxidized to form cupric oxide. The oxidation is accomplished by treating the metal surface with an oxidizing agent. The oxidized metal surface is thereafter exposed to an aqueous reducing solution containing a mixture of sodium metabisulfite and sodium sulfide to convert the oxide coating to a roughened metallic copper coating on the copper surface. The roughened metallic copper surface coating is subsequently treated with a passivating agent and this treatment provides a superimposed protective coating which retards reoxidation of the metallic copper coating on the surface of the copper foil or sheet during further processing. The presence of the rough, irregular passivated copper layer over a comparatively thick copper circuit path that defines the electrical function of the printed circuit board provides an enhanced bond between the circuit copper and the organic resin component of the laminated multi-layer printed circuit board.

In one embodiment of the invention, a thin layer of electrolytic or electroless passivating metal, preferably nickel or nickel alloy, is deposited on the copper surface subsequent to treating the black oxide-coated copper surface with sodium metabisulfite/sodium sulfide reducing solution. The nickel or nickel alloy passivated copper surface is then subjected to lamination conditions under heat and pressure as required in high temperature applications.

In another embodiment of the invention, the passivating layer is formed with a silane coupling agent, which is deposited on the copper surface subsequent to treating the black oxide-coated copper surface with the sodium metabisulfite/sodium sulfide reducing solution. The passivated copper surface is then subjected to lamination conditions under heat and pressure as required in high temperature applications The process of the invention can be employed at any of several different stages in the manufacture of printed circuit boards. For example, the process can be employed preceding the application of a photoresist mask to the copper foil laminates or following the step of etching the photoresist-masked copper foil laminates.

DETAILED DESCRIPTION OF THE INVENTION

The present invention involves a process for constructing copper foil laminates, particularly for use as printed circuit boards. The process is especially useful for constructing multilayer printed circuit boards in which two or more printed circuit boards are firmly bonded together with cured resinous materials. Multilayer printed circuit boards made with the present invention avoid the detrimental or pink-ring effect.

According to the present invention, a printed circuit board is made by joining a dielectric substrate such as a resin impregnated fiber glass mat (e.g. on epoxy or phenolic resin impregnated fiberglass mat) to a copper sheet or foil, e.g. by laminating in the conventional manner, e.g., high temperature and pressure, employed in the art. The copper foil or sheet may be treated on one side to provide a roughened surface to enhance adhesion with the resin impregnated substrate. Conventional chemical methods for surface roughening which may be used in practicing the present invention are treatment with aqueous oxidizing solutions containing one or more of the following constituents: hydrochloric acid, sulfonic acid, nitric acid, phosphoric acid, acetic acid, copper compounds such as cupric chloride, copper sulfate, iron compounds such as ferric chloride, ferric sulfate, alkali metal chlorides (e.g. potassium chloride), and ammonium persulfate. Mechanical abrasion techniques such as honing with a grit, sanding, etc. may also be used to roughen the copper surface.

The roughened copper surface is joined to the partially cured (B stage) resin impregnated substrate by the application of heat and pressure to form a circuit board. The copper surface of the printed circuit board may be coated or covered with a conventional photoresist dry film masked which may thereafter be exposed and developed in the conventional manner to form a copper circuit pattern etched onto the resin substrate. The etched printed circuit board carrying a predetermined circuit pattern of electrically conductive copper lines may then be joined, by stacking or layering, to one or more similar printed circuit board constructions using the process of the present invention, to form a multilayer printed circuit board assembly.

Conventional substrate materials employed in fabricating printed circuit boards may be used in practicing the method of the present invention. A preferred substrate comprises a fiberglass mat. A fiberglass mat impregnated with epoxy resin or other reinforced resinous materials is preferably employed to form the substrate of the printed circuit board. The dielectric resin may be formulated with brominated difunctional epoxy (fire resistant grade 4 or FR4), tetrafunctional epoxy, bismaleimide triazine, polyimide, cyanate ester and the like.

A layer of copper in the form of a sheet or foil is joined to the resin impregnated substrate. Preferably, the copper is electrolytic copper foil conventionally employed in making printed circuit boards. Electrolytic copper foil is obtained by depositing copper electrolytically on a rotating drum placed in a copper plating bath then stripping the layer of deposited copper foil from the drum. Methods for preparing electrolytic copper foil for use in preparing printed circuit boards are described, for example, in U.S. Pat. Nos. 3,585,010 and 3,984,598.

The copper foil that becomes the circuitry after photoetching is typically electrodeposited metal foil that may be any thickness from $1/8$ oz/ft$^2$ (0.000175") to 5 oz/ft$^2$ (0.007") or thicker. The copper metal surface may also be applied to the substrate from a sheet or roll of copper metal. The exact photoetched design of the copper circuitry varies according to end usage, but does not effect the bond enhancement process of the present invention.

In practicing the invention, the exposed copper foil surface (with or without an etched photoresist mask) is cleaned and etched using conventional techniques (for general discussion of conventional methods for etching and cleaning copper surfaces see *Metals Handbook: Desk Edition,* Editors H. E. Boyer and T. L. Gall, American Society for Metals (Metals Park, Ohio), 1985.) In general, etching and cleaning of metal surfaces is dependent on the type of metal as well as the type of contaminant one desires to remove from the metal surface. Known chemical etching methods include treatment with aqueous or alcoholic solutions containing one or more active agents of acids, bases or salts. Examples of suitable active agents include hydrochloric acid, hydrofluoric acid, nitric acid, sulfuric acid, hydrogen peroxide, and ammonium hydroxide. Among chemical methods for cleaning copper surfaces are treatments with aqueous solutions containing alkali hydroxides, sulfuric acid and hydrochloric acid. A wide variety of cleaning solutions are commercially available. For example, Electrobritee 402, commercially available from Electrochemicals, Inc., is a useful alkaline cleaning compound intended for use on printed circuit inner layers for removal of common organic contaminants such as oils and grease and may be used in constructing multi-layer circuit boards according to the present invention.

The initial step of the present invention is to treat a surface of the copper foil with an oxidizing agent to form a black copper oxide (CuO). A variety of so-called "black oxide" procedures well known in the art can be used to transform the copper metal surface to a black copper oxide surface. Treatment with such oxidizing agents creates an array of black copper oxide peaks or filaments on the surface of the metal. Black (cupric) oxide formation methods that are known in the art and useful in the instant process include treatment of the copper surface with an alkaline sodium chlorite solution (U.S. Pat. Nos. 2,955,974; 3,177,103; 3,198,672; 3,240,662; 3,374,129; and 3,481,777), alkaline permanganate (U.S. Pat. No. 3,544,389), hydrogen peroxide (U.S. Pat. No. 3,434,889) and air at elevated temperatures (U.S. Pat. No. 3,677,828). The objective of these treatments is to form a cupric oxide layer on the surface of the copper sheet or foil.

The thickness of the copper oxide layer is usually defined by a specific coating weight due to the extreme porosity of the coating. The specific coating weight of copper oxide can be determined by gravimetric or electrolytic procedures. In gravimetric determinations, a copper laminate bearing a copper oxide coating is baked for about 30 minutes at 121° C. to remove moisture. The sample is then weighed and the weight is recorded as $W_1$. The copper oxide layer is then chemically stripped from the sample with 10% aqueous sulfuric acid, rinsed with water and rebaked to remove moisture. The sample, minus the copper oxide, is then reweighed and the weight is recorded as $W_2$. The specific coating weight is then calculated by the following equation:

$$\text{specific coating weight} = \frac{W_1 - W_2}{\text{area(cm}^2)}$$

Alternatively, the specific coating weight can be determined electrolytically by computing the amount of electricity consumed for reduction per unit area of copper when the copper oxide layer is electrochemically reduced in an aqueous electrolyte solution (i.e. 1M KCl). The specific coating weight of the black oxide coating on the copper surface is desirably between about 0.4 and about 1.4 mg/cm$^2$, preferably between about 0.4 and about 0.8 mg/cm$^2$ and most preferably about 0.6 mg/cm$^2$.

The thickness of the copper oxide layer can be estimated using scanning electron microscopy (SEM) by measuring the average height of black oxide dendrites extending from the oxide layer and multiplying the value by a factor of about 1.5 to compensate for the base oxide coating underlying the dendrites. For example, the thickness of the coating corresponding to a specific coating weight of about 0.6 mg/cm² is estimated to be about 3000 and about 5000 angstroms.

After the desired weight of the black oxide coating is generated on the surface of the copper foil, the black oxide coated copper foil is then immersed in a aqueous reducing bath solution containing a mixture of sodium metabisulfite ($[Na_2S_2O_5]$, also known as sodium pyrosulfite) and sodium sulfide ($Na_2S$) to convert the black oxide coating to a roughened metallic copper coating.

The aqueous reducing solution generally contains between about 25 and about 100 grams of sodium metabisulfite, preferably about 50 grams, per liter of solution and between about 0.08 and about 1.0 grams of sodium sulfide, preferably about 0.1 grams, per liter of solution. Sodium hydroxide is also added to the solution in an amount of between about 3 to about 20 grams of sodium hydroxide, preferably 15 grams, per liter of solution. Sodium hydroxide is employed to adjust the pH of the reducing solution to the desired working pH range of about 5.5 to about 8.5, preferably about pH 7.0.

Although sodium salts of metabisulfite, sulfide, and hydroxide are preferred, other salts, e.g. potassium or ammonium salts or combinations thereof, are also contemplated for use in the present invention provided that the cation allows for complete dissolution of the active components (metabisulfite and sulfide) and does not adversely interfere with the bond enhancement process of the invention.

The black oxide-coated copper sample is immersed in the preferred reducing bath, with mechanical agitation, at a temperature between about 25° C. and about 80° C., preferably about 60° C., for a period between about 5 and about 15 minutes, preferably for about 9 minutes, at a preferred load of about one square foot of copper surface per gallon of solution.

Without being bound by any particular theory of operation for the present invention, it is believed that during the process of converting a black oxide-coated copper surface to a roughened metallic copper-coated copper surface with the sodium metabisulfite/sodium sulfide solution, between about 10% and about 20% of the black copper oxide coating is converted directly to a roughened metallic copper coating according to the equation given below.

$$CuO+2H^++2e^-\rightarrow Cu+H_2O$$

As no amorphous cuprous oxide is formed on the copper surface treated in accordance with the method of the present invention, the use of special treatments or steps to halt secondary reduction processes leading to copper powder, e.g. acid-salt wash and polymeric addition agents, can be avoided. The black oxide remaining on the copper surface after the reducing solution treatment may be partially or completely dissolved into the metabisulfite/sulfide reducing solution, depending on the duration of the immersion time of the copper foil in the reducing solution. The dissolution of black oxide is presumably due to the interaction of black oxide with metabisulfite ions or bisulfite ions formed by disproportionation of metabisulfite ions in aqueous solution.

In practicing the invention, it is important that the reducing solution contain a mixture of both sodium metabisulfite and sodium sulfide. Treatment of black oxide copper surfaces with solutions containing solely sodium metabisulfite or sodium sulfide does not produce a copper surface having superior bond adhesion characteristics. For example, when a black oxide copper surface is treated with a reducing solution containing only sodium metabisulfite or sodium sulfide, little or no black oxide coating conversion occurs. Likewise, treatment of black oxide copper surfaces with sodium sulfide produces a copper surface having a blotchy black appearance with poor bond adhesion properties.

After treatment with the reducing solution, the treated copper surface may be washed with a dilute aqueous acid solution to remove surface debris and traces of unconverted black oxide. While the acid-wash step is optional, it is preferred that an acid wash be employed to clean the treated copper surface prior to further processing. The acid step, however, may be bypassed by prolonging the immersion of the black oxide-coated copper sample in the reducing solution for a time period greater than 15 minutes. If coupling agents are employed for passivation, then this acid wash step must be avoided. The acid wash will destroy the coupling agents affinity for the treated copper surface.

Non-limiting examples of dilute acids for use in the post-reducing treatment acid-wash step include dilute solutions of sulfuric acid, hydrochloric acid, and phosphoric acid. A preferred acid is sulfuric acid. The concentration of the aqueous acid solution is generally between about 1.0% and about 5.0% (v/v), preferably about 3.0%. The treated copper foil may be immersed, with mechanical agitation, into a dilute acid solution set at a temperature between about 200° C. and about 450° C. for a time period of about 2 minutes.

Since the metallic copper coating on the copper surface can be readily reoxidized on air exposure, the roughened copper surface should be passivated. Passivation provides a superimposed protective coating or film on the treated copper surface which retards reoxidation of the treated copper surface during further processing.

A wide variety of conventional passivating agents, which provide variable degrees of protection of copper from oxidation, are contemplated for use in the present invention. Non-limiting examples of passivating agents include chromium trioxide, sodium tungstate, sodium molybdate, benzotriazole, potassium permanganate, diethylene glycol, lactic acid, citric acid, tellurium chloride and coupling agents. Preferred passivating agents for use in the present invention are chromate, benzotriazole, coupling agents and permanganate which, in addition to preventing reoxidation of the treated copper surface by formation of a protective film, enhances the bond adhesion between the roughened metallic copper-coated copper surface prepared according to the method of the present invention and a resinous substrate. The most preferred passivating agents for use in the present invention are a chromate or a coupling agent.

Suitable chromate passivating agents for use in the present invention include aqueous solutions of chromium salts. For example, the roughened metallic copper-coated copper surface may be immersed into a passivating solution of about 2.0 g chromium trioxide per liter of water which is adjusted to a pH of about 2.0 with sodium hydroxide. The copper foil is immersed into the passivating solution for between about 45 seconds and about 4 minutes, preferably about 30 seconds at a temperature between about 20° C. and 65° C., preferably about 25° C. with mechanical agitation. The chromate-passivated copper foil is then rinsed with water and forced air dried (e.g. for 8 to 10 minutes at 45° C.). The resultant superimposed passivating chromate coating or film is believed to include a matrix of hexavalent chromium, trivalent chromium, cuprous and cupric ions and has an estimated thickness of about 10 to about 20 angstroms.

Suitable coupling agents for use in the present invention include amino coupling agents and amino-silane coupling agents. The coupling agents improve the bonding of the treated copper surface to the resinous substrate. This will provide a mechanical linkage so that the finished product is able to withstand thermal and mechanical excursions. Further, the passavation treatment prevents oxidation of the copper surface during storage, prior to subsequent lamination and improves resistance to acid. The preferred thickness of the coupling agent is a monomolecular layer, but a greater thickness, i.e., several monomolecular layers would function as well.

Non-limiting examples of suitable coupling agents are silyl amines such as γ-aminopropyl-triethoxy silane, $(NH_2 (CH_2)_3 Si(OC_2H_5)_3$, an aminoalkyl silane solution such as amino alkyl silane solution A1106 available from Union Carbide Co. This is believed to be an oligomeric aminosilane having the general formula, $(NH_2—CH_2—CH_2—CH_2—Si—O_{1.5})_n$ wherein n is from 1 to about 3; modified aminosilanes such as a triaminosilane solution A1128, available from Union Carbide Co., vinyltrimethoxysilane, β-(3, 4-epoxycyclohexyl) ethyltrimethoxysilane, γ-glycidoxypropyltrimethoxysilane, isocyanato silanes such as isocyanato propyl triethyl silane and the like; or amines such as isopropyl amine, triisostearoyl amine, titanate amine, 2-(N,N-dimethylamino) isobutanol, methacrylamide functional amines such as zirconium IV 2,2-dimethyl 1,3-propanediolato, bis(dioctyl) pyrophosphato-0 (adduct) 2 moles N,N-dimethylamino-alkyl propenoamide available from Kenrich Petro-chemicals Inc. (catalog number NZ 38J), and the like; titanium derivatives such as tetraocytl di(ditridecyl)phosphito titanate, tetra-(2,2-diallyloxymethyl) butyl-di(ditridecyl)phosphito titanate, neopentyl-(diallyl) oxytri(diocytl)pryo-phosphato titante, neopentyl-(diallyl) oxy tri(m-amino)phenyl titanate and the like; or zirconium derivatives such as tetra (2,2 diallyloxymethyl)-butyl-di (ditridecyl)phosphito zirconate and the like. The preferred coupling agents are the silyl amines such as γ-aminopropyl-triethoxy silane, $(NH_2(CH_2)_3 Si (OC_2H_5)_3$ and the aminoalkyl silane solution, vinyltrimethoxysilane, β-(3,4-epoxycyclohexyl) ethyltrimethoxysilane, γ-glycidoxypropyltrimethoxysilane.

Between each of the preceding steps, water, preferably purified by conventional methods, e.g. deionization or reverse osmosis, is used as a rinsing agent to remove any remaining solvents, solutions or other unwanted material which may be present. It is preferred that purified water be used as a rinsing agent in the steps following treatment of the copper foil with the reducing solution of the invention. Purified water is also preferably used to prepare all the aforementioned solutions, otherwise cosmetic and functional problems in the final laminate product may result due to the interaction of copper metal with water hardness components, metal ions, organic impurities or other contaminants commonly found in water.

Figure 1:
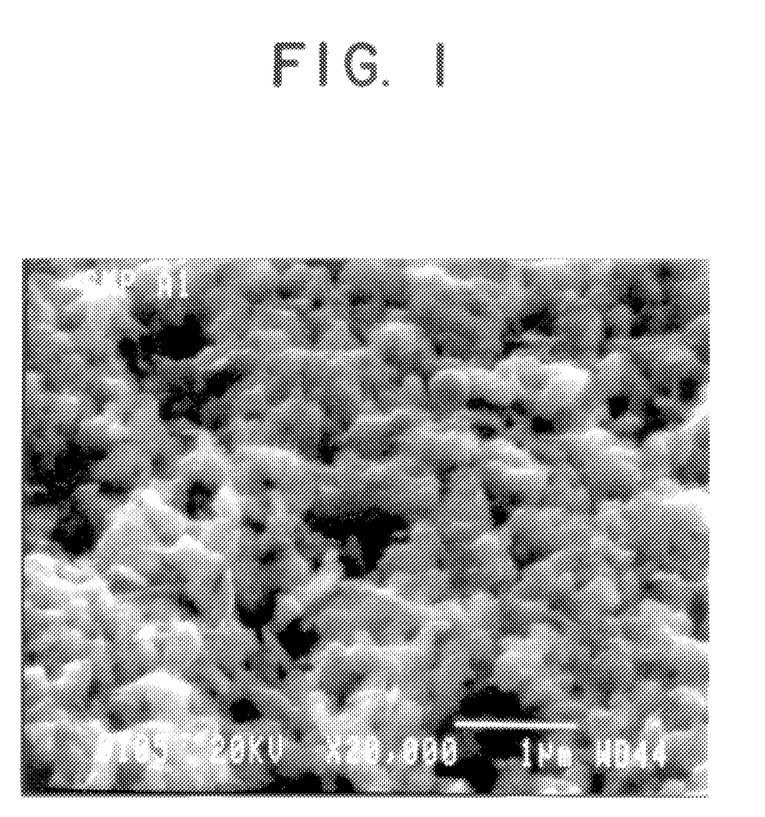
FIG. 1 is an scanning electron microscopic (SEM) photograph of a roughened metallic copper coating generated on a copper surface by treating an intermediate black oxide-coated copper surface with an aqueous reducing solution containing 50 gm/L sodium metabisulfite and 0.1 gm/L sodium sulfide followed by chromate passivation with an aqueous solution of 2.0 gm/L chromium trioxide.

After treatment with the passivating agent, the passivated copper foil surface is essentially irregular or roughened. On microscopic inspection, the surface has the appearance of a closely spaced array of metallic copper projections. Chromate-passivated copper surfaces prepared by the method of the present invention have a roughened surface with irregular vertical projections about 0.15 microns high and between about 100 angstroms and about 200 angstroms diameter at the surface. An SEM photograph of the microstructure of the passivated copper surface is shown in FIG. 1.

Copper powder must be substantially absent from the passivated surface in order to prevent reduction in peel strength and electrical shorting between adjacent copper circuit lines (or traces) in the printed circuit. One qualitative test for the presence of copper powder involves wiping the metal coated surface to be tested with a soft paper tissue or application of adhesive tape to the treated surface. No powder transfer is found when such tests are conducted on the passivated copper surfaces prepared according to the present invention.

In one embodiment of the invention after treatment of the oxidized copper surface with the sodium metabisulfite/sodium sulfide reducing solution, excess reducing reagent is rinsed off the treated copper surface and a thin layer of a passivating metal, preferably nickel or nickel alloy, is then deposited on the treated copper surface without additional passivation treatment. Addition of the passivating metal layer onto the treated copper surface may be achieved by using electrolytic or electroless deposition procedures known in the art. Typically, a layer of metal between about 5 and 15 microinches thick, preferably about 10 microinches thick, is deposited on the reduced copper surface to provide additional bond durability for high temperature applications. For example, a plated nickel layer applied directly over the roughened metallic copper-coated copper surface provides superior passivation properties relative to chromate passivation. Desired deposited metal layers for passivation include pure nickel or alloy composed of nickel-phosphorus, nickel-boron or nickel-zinc.

For treated copper foil not having a photoresist mask, either passivating electrolytic or electroless nickel deposition may be used. For photoetched treated copper foil no longer having electrical continuity, electroless deposition is preferred. Electroless nickel deposition may be accomplished with either co-deposition of between about 2% and about 10% weight phosphorus or between about 0.1% and about 10% by weight boron. Electrolytic deposition of nickel-zinc may occur in any metal ratio, however a 90/10 zinc/nickel ratio is preferred.

Aqueous plating bath formulations preferred for nickel-phosphorus electroless deposition generally comprise between about 15 gm and about 30 gm of nickel sulfate, preferably about 28 gm; between about 10 gm and about 20 gm of sodium acetate, preferably about 17 gm; between about 20 gm and about 30 gm of sodium hypophosphite, preferably about 24 gm; and between about 1 mg and about 5 mg of lead acetate, preferably about 1.5 mg, per liter of solution. The nickel-phosphorus electroless deposition is conducted at a solution pH of about 4.5 and temperature of about 85° C.

For nickel-boron electroless deposition, typical plating bath formulations comprise between about 15 gm and about 30 gm of nickel sulfate, preferably about 25 gm; between about 10 gm and about 20 gm sodium acetate, preferably about 15 gm; between about 1 gm and about 10 gm of dimethyl amino borane, preferably about 4 gm; and between about 1 mg and about 5 mg of lead acetate, preferably about 2 mg, per liter of solution. The nickel-boron electroless deposition is conducted at a solution pH of about 5.9 and temperature of about 27° C.

Typical electroless plating rates are about 0.0005" per hour, hence the preferred thickness of about 10 microinches may be achieved in about 50 seconds. For electroless deposition processes, the best results are obtained when metabisulfite/sulfide treated copper surfaces are immersed into an aqueous solution containing about 10 gms of dimethyl amino borane immediately before transfer to the electroless plating bath without rinsing. This preconditioning step substantially improves the uniformity of the deposition of nickel alloy onto the reduced copper surfaces of the present invention.

For pure nickel electrolytic deposition, preferred plating bath formulations comprise aqueous solutions containing between about 200 gm and about 300 gm of nickel sulfamate, preferably about 250 gm; between about 5 gm and about 10 gm of nickel chloride, preferably about 7.5 gm; between about 20 gm and about 40 gm boric acid, preferably about 30 gm; and between about 0.5 gm and about 2 gm of sodium lauryl sulfate, preferably about 1 gm, per liter of solution. Pure nickel electrolytic deposition is conducted at a solution pH of about 5.0 and temperature of about 54° C.

Aqueous plating bath formulations for nickel-zinc alloy electrolytic deposition suitable for use in the present invention comprise between about 10 gm and about 30 gm of nickel sulfate, preferably about 20 gm; between about 50 and about 300 gm of zinc sulfate, preferably about 180 gm; between about 50 gm and about 100 gm of concentrated sulfuric acid, preferably about 60 gm; and between about 0.5 gm and about 2 gm of sodium lauryl sulfate, preferably about 1 gm, per liter of solution. The nickel-zinc electrolytic deposition is conducted at a solution pH is less than or equal to 1.5 with a temperature set at about 40° C.

Typical electrolytic plating operations occur at a current density of about 35 amperes per square foot for about 10 seconds. At these conditions, the plating cycle provides a metal layer of approximately 10 microinches. By manipulating the plating current density, the surface microroughness of the metallic copper-coated copper surface may be enhanced and thicker plating deposits may be applied without degrading bond strength.

The method of the present invention can be used to treat at least one surface of copper foils or sheets in the manufacture of printed circuit boards. In one embodiment, copper foil or sheets may be treated on one or both sides prior to lamination with a resin impregnated substrate. Both the matte or smooth sides of the copper foil are equally amenable to the present treatment and, if preferred, one side of the copper foil may be temporarily masked during processing with adhesive tape or the like to prevent treatment of the masked surface.

Resin impregnated substrates clad on one or both sides with copper foil or sheets may be treated by the present method prior to application of a photoresist mask and photoetching. In another embodiment of the invention, a photoetched printed circuit board, clad on one or both sides with copper foil circuitry, can be treated by the present method prior to assembly into a multilayer printed circuit board. The present method is especially suitable for treating copper circuit lines and areas which are not electrically connected.

In another embodiment of the invention, the roughened metallic copper-coated surfaces of copper foil or sheets alone or adhered to a resin impregnated substrate before or after addition of a resist-mask and etching steps, may have a super-imposed passivating metallic layer such as nickel or nickel alloy which imparts added bond durability to the printed circuit board especially for high temperature applications.

The method of the present invention promotes strong adhesive bonding between treated surfaces of copper foil or sheets with adjacent resin impregnated substrates and is especially useful for printed circuit board fabrication. Printed circuit boards prepared according to the present invention may be used to assemble multilayer circuit boards.

A plurality of double-sided printed circuit boards may be bonded to each other through layers of semicured resin material such as epoxy resin, prepreg resin and the like which are subsequently cured at elevated temperatures and pressures to form the complete multilayer circuit board assembly. The multilayer circuit boards thus prepared can then be drilled to form a plurality of through-holes which may then be cleaned with acid solutions to remove resin smears without the concomitant delamination problems seen with the prior copper oxide adhesion layers. The through-holes may then be soldered or electroplated with copper to establish electrical interconnections between the inner layers of the multilayer printed circuit board assembly. The plated through-holes do not exhibit the pink-ring effect described in the prior art upon exposure to acidic cleaning solutions. The invention provides superior bonding at the through-hole, not only of the copper surface to the laminate, but also at the junction between the copper surface of the circuit board and the metallic surface coating the through-hole.

The working examples set forth below are intended to illustrate the invention without limiting its scope.

EXAMPLE 1

SODIUM METABISULFITE/SODIUM SULFIDE REDUCTION TREATMENT OF AN OXIDIZED COPPER FOIL

A 1 oz/ft$^2$ (0.0014") 5"×5" electrodeposited copper foil was cleaned with an alkaline solution, containing Electrobrite® 402, prepared by dissolving 3 ounces of the powdered chemical per gallon of deionized water, for 3.5 minutes at 65° C., followed by a warm water (27°–32° C.) rinse and air sparging for 3 minutes. The foil was then rinsed with dilute acid (10% sulfuric acid) for 1.5 minutes at 27°–32° C.

Figure 2:
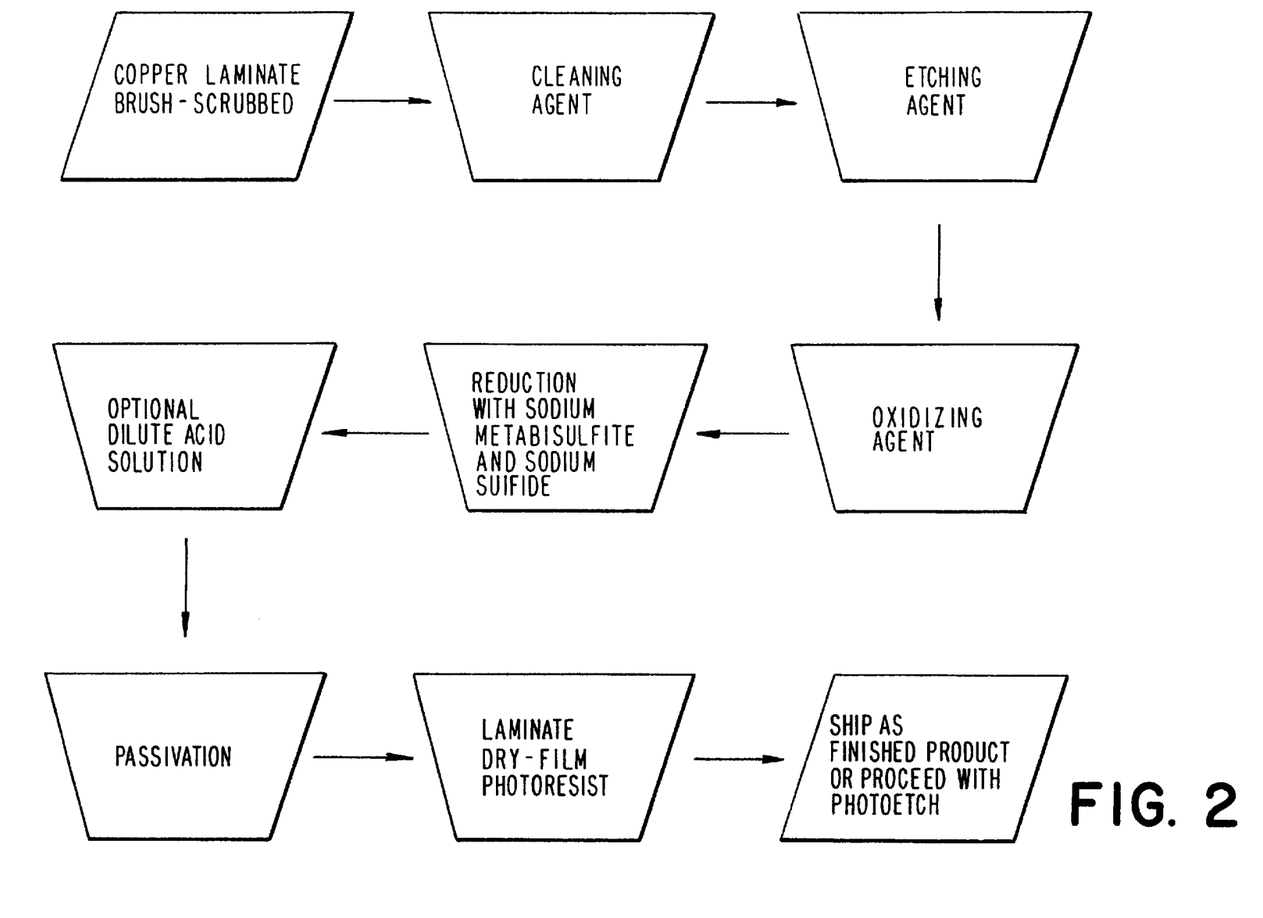
FIG. 2 is a flowchart which illustrates the process of preparing the enhanced bond surface coating of the present invention prior to photoetching.
Figure 3:
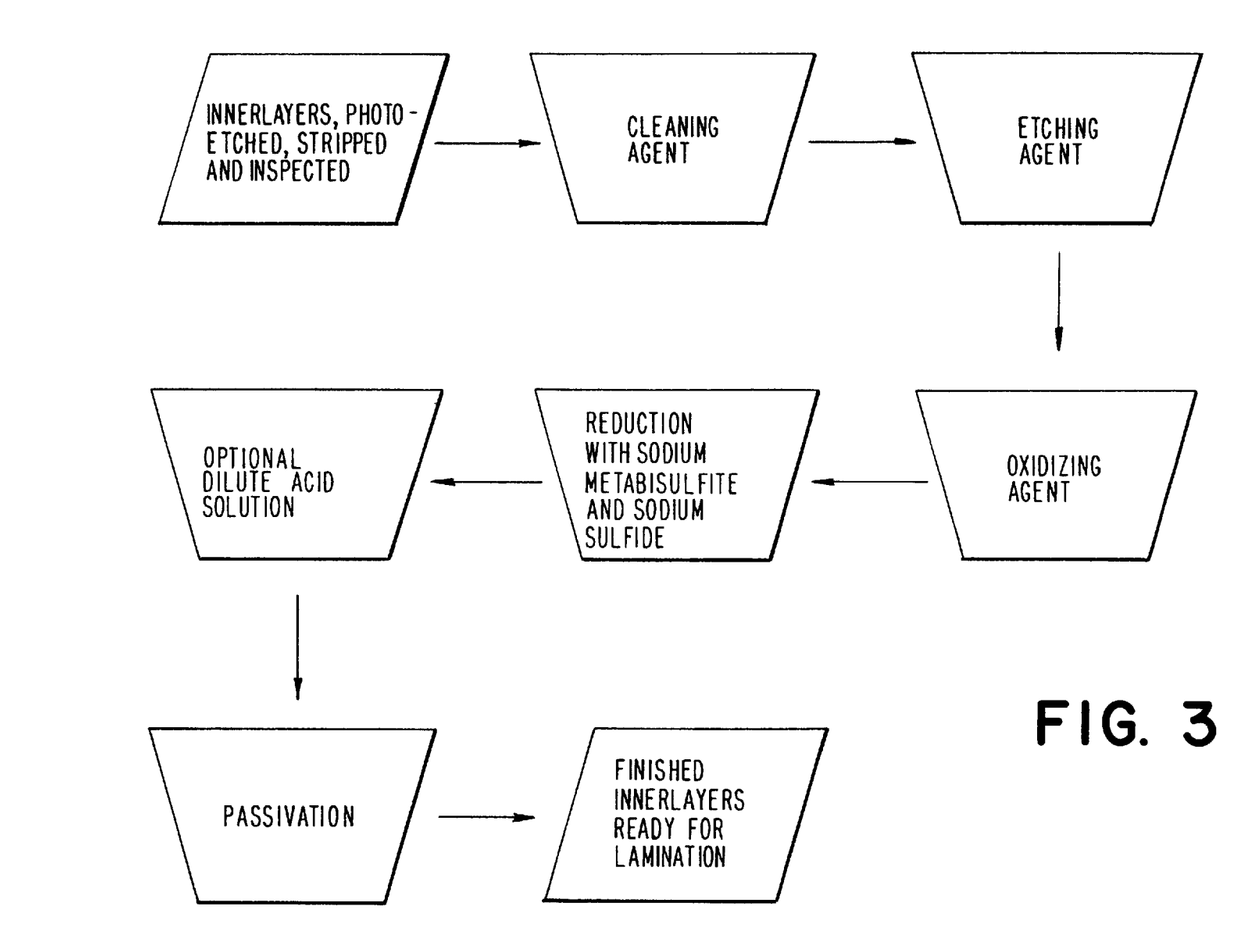
FIG. 3 is a flowchart which illustrates the process of preparing the enhanced bond surface coating following photoetching according to the present invention.

The clean copper foil was etched with 5.5–6.5% hydrogen peroxide in 9–10% sulfuric acid for 1.5 minutes at 65° C. followed by a water rinse at 27°–32° C. 1–2.5 microns of copper was removed from the copper metal surface by this etching procedure. The clean, etched copper foil was then rinsed with deionized water (21° C.) for 1 minute, rinsed with 10% sulfuric acid, and rinsed with water at 27°–32° C. for 1 minute. A black oxide layer was formed by treating the copper surface with an alkaline solution of sodium chlorite (i.e. MacuBlack® LT oxide solution, obtained from MacDermid Inc. of Waterbury, Conn.) for 4 minutes at 75° C. The copper foil containing the black oxide coating was then rinsed with deionized water for 5.5 minutes. The black oxide coated copper foil was then immersed in an aqueous reducing solution (pH 7.0) containing 50 grams/L sodium metabisulfite, 0.1 grams/L sodium sulfide and 5 grams/L sodium hydroxide for 9 minutes at 57° C. The treated copper foil was then rinsed with deionized water, with mechanical agitation, for 3 minutes at 21° C. and then immersed into an aqueous 3% (v/v) sulfuric acid bath for 2 minutes at 38° C. The acid washed foil was then rinsed with deionized water for one minute at 21° C. The acid-washed sample was then immersed in an aqueous chromate passivating solution (pH 2.0) containing 2.0 gram/L chromium trioxide for about 45 seconds at 210° C. with mechanical agitation. The chromate passivated copper foil was then rinsed twice with deionized water for 3.0 minutes at 210° C., rinsed once with deionized water for 30 seconds at 49°–60° C., with mechanical agitation, and forced air dried for 8 to 10 minutes at 107° C. These process steps are outlined in the flow charts of FIGS. 2 and 3 which illustrate the process of the present invention.

Laminate specimens having the passivated copper foil were then prepared. These laminates were then subjected to a variety of stress conditions normally employed in the production of multilayer printed circuit boards. Specimens were subjected independently to solder shock, acid and/or thermal stress followed by peel strength determination as described in Examples 2 to 6.

EXAMPLE 2

PEEL STRENGTH TEST

A standard peel test is a qualitative test used to characterize the actual bond strength achieved between treated copper layers and resinous layers of multilayer circuit board built with discrete inner layers. Rigid peel strength specimens were constructed by stacking a 2113-type transparent fiberglass mat on top of three 7628-type transparent fiberglass mats. Semi-cured brominated difunctional epoxy resin (FR4) was impregnated into all four fiberglass mats. A 1 oz/ft$^2$ (0.0014") thick electrodeposited 5"×5" copper foil, treated on the gloss side with the procedure described in Example 1 was then positioned on the treated side on the exposed face of the 2113 mat to form a multilayered structure. The structure was then laminated by pressing at a pressure of 575 psi at 177° C. The adhesion value of the copper foil laminate was determined using a pull tester to measure the tension required to pull 1 cm strips of foil from the epoxy layer at a 90 degree angle at a rate of 1 inch per minute. Seven specimen strips were tested and had an average peel strength of 5.0 lbs./in.

EXAMPLE 3

HCL/PINK-RING TEST

In this Example, laminate specimens prepared as described in Example 2, were subjected to a acid pink-ring test and peel strengths were determined. Black oxide laminates prepared by a conventional procedure served as a control. A standard test for pink-ring measures the susceptibility of a copper foil laminate surface to acid attack, by immersing a test specimen in 10% HCL at 30° C., for up to several hours. Peel strength decreases significantly in proportion to the area destroyed or delaminated by acid attack, e.g., pink-ring.

Conventional black oxide laminates were prepared according to the following procedure: A 1 oz/sq. ft. (0.0014") 5"×5" electrodeposited copper foil was cleaned with an alkaline solution, containing Electrobrite® 402 cleaner, prepared by dissolving 3 ounces of the powdered chemical per gallon of deionized water. The sample was immersed for 3.5 minutes at 65° C. followed by a warm water rinse (27°–32° C.) agitated by air sparging for 3 minutes. The foil was then rinsed with dilute acid (10% sulfuric acid by volume) for 1.5 minutes.

The clean copper foil was then etched with a solution of 5% hydrogen peroxide and 15% sulfuric acid (by volume) for 1.5 minutes at 35° C., followed by a 3 minutes of rinsing in warm water (27°–32° C.) with air sparging. 1–2.5 microns of copper was removed from the copper metal surface by this etching procedure. The clean, etched copper foil was then immersed in an alkaline solution of sodium chlorite (i.e. MacDermid MaCuBlack® LT oxide solution) for 5.5 minutes at 75° C. This solution generated a black oxide layer on the copper surface having a weight density of 0.6–0.8 mg/cm$^2$. The black oxide-coated copper foil was then rinsed for 3 minutes in warm water (27°–32° C.) agitated with an air sparger. The black oxide coated foil was then rinsed for 30 seconds in deionized water at 49° C., and dried for ten minutes in a heated air dryer (107° C.).

Prior to lamination, the black oxide coated copper foil sample was baked for 30 minutes at 107° C. The foil sample was then laminated, as described in Example 2, to one piece of 2113-type fiberglass mat and three pieces of 7628-type fiberglass mat, to construct control specimens for black oxide testing.

One centimeter spaced lines were etched with a cupric chloride solution (18 ounces per gallon of water) for 3 minutes at 52° C. on the exposed copper surfaces of the control laminate specimen and laminates containing a chromate-passivated copper foil (Example 2). The etched laminates were then immersed in an aqueous 10% (v/v) HCL solution at 30° C.

Figure 4:
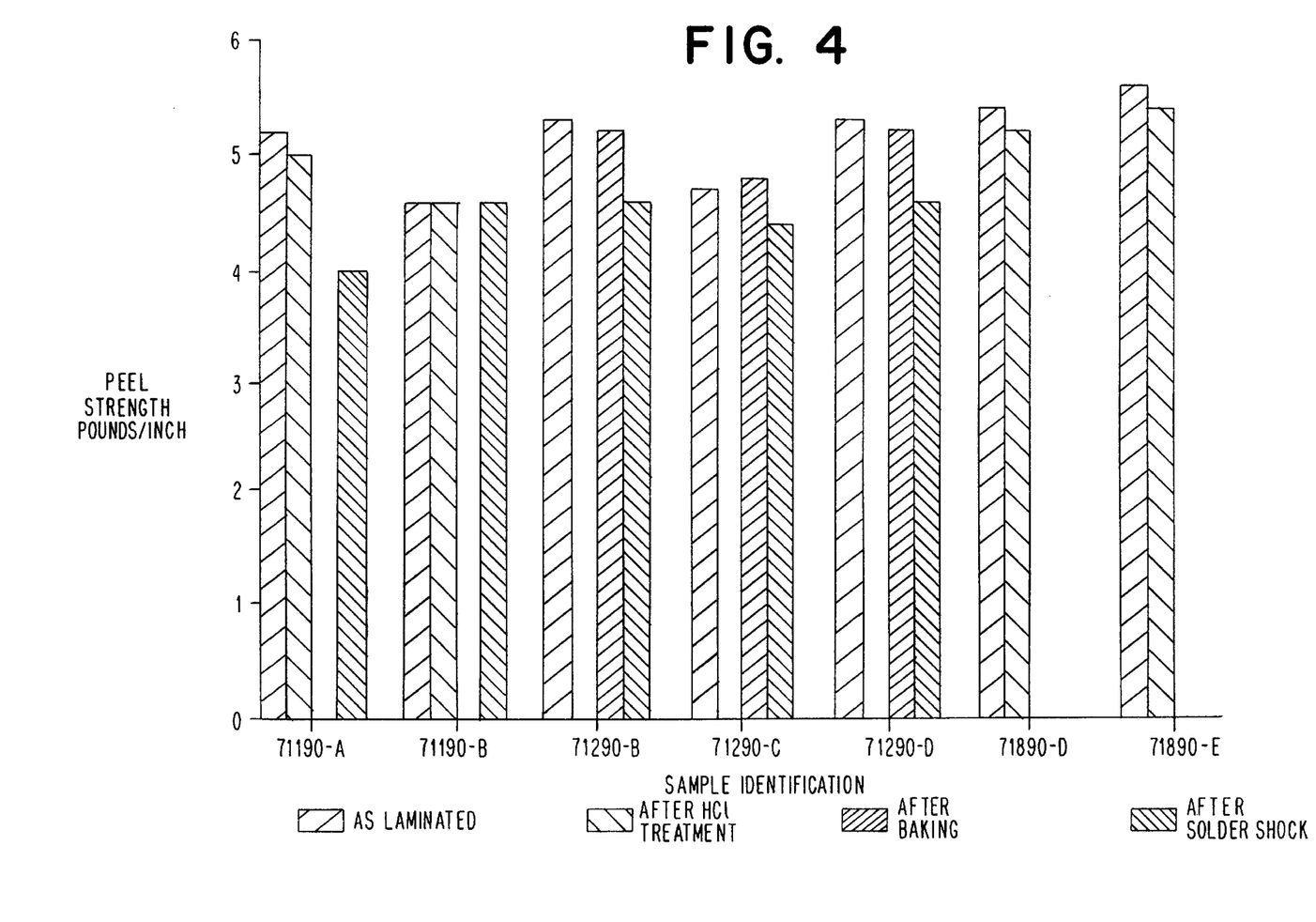
FIG. 4 is a graph summarizing the results of peel strength data of seven peel specimens comprising a transparent resin impregnated substrate laminated to a metallic copper-coated surface of copper foil prepared according to the invention.
Figure 5:
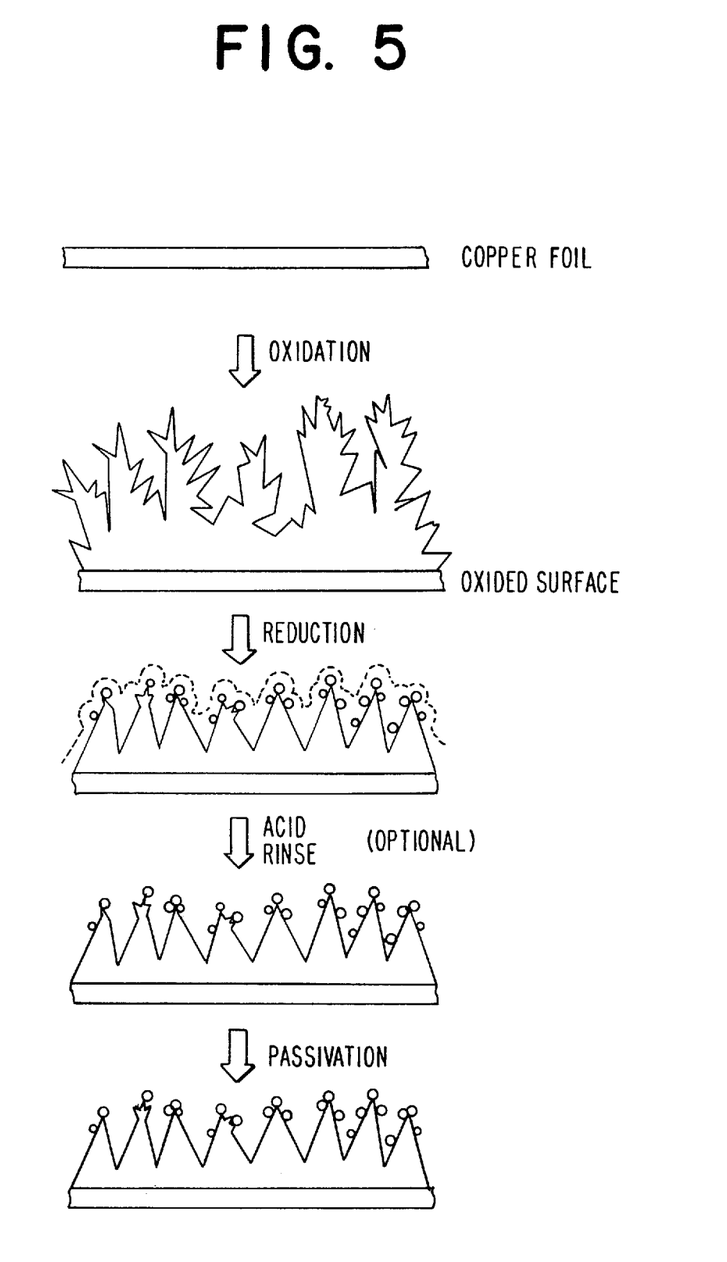
FIG. 5 illustrates a copper foil surface undergoing treatment with the process of the present invention.

After twenty minutes, the control specimen showed deterioration and dissolution of the black oxide by as much as 3–5 mm inward from each edge, resulting in a pink region comparable to the pink-ring phenomenon observed in printed circuit boards of this type. In contrast, laminates containing the passivated copper foil prepared in accordance with Example 2 did not show any detectable deterioration at the interface between the treated copper foil and resin substrate even after two hours immersion in 10% HCL at 30° C. In fact, the pink-ring phenomenon was entirely absent, nor was any significant reduction in peel strength found (FIG. 4).

EXAMPLE 4

SOLDER SHOCK TEST

This test simulates the thermal shock encountered in solder reflow component assembly processes for printed circuit boards. A peel specimen was floated exposed copper-side down on molten solder (63% lead, 37% tin) at 288° C. for 30 seconds. After cooling to ambient temperature, the peel strength was measured (FIG. 4) was described in Example 2. The peel specimen showed excellent blister resistance to molten solder and no detectable signs of degradation.

EXAMPLE 5

THERMAL STRESS TEST

This test simulates the thermal cyclizations encountered during multilayer circuit board processing baking steps. A peel specimen was baked at 177° C. for 1 to 4 hours. After cooling to ambient temperature, the peel strength was measured as described in Example 2. Alternative high (125° C.) and (−40° C.) low temperature cycling produced no change in the peel strength nor any detectable signs of degradation. The results of the peel strength test are shown in FIG. 4.

EXAMPLE 6

COMPARATIVE EVALUATION OF TWO CONVENTIONAL COPPER-PLASTIC LAMINATES WITH LAMINATES OF THE PRESENT INVENTION

In this example, a comparison of mechanical and peel strengths was made with laminates prepared in accordance with Example 2, conventional black oxide laminates (Example 3), and laminates prepared by the method described in U.S. Pat. No. 4,997,516. Copper foil treated with sodium dithionite/polymeric addition agent solution as described in U.S. Pat. No. 4,997,516 was used to prepare copper plastic laminates according to the following procedure:

A 1 oz/sq. ft. (0.0014") 5"×5" electrodeposited copper foil was cleaned with an alkaline solution containing 3 ounces of Electrobrite® 402 cleaner per gallon of deionized water. The sample was immersed for 3.5 minutes at 65° C. followed by a warm water rinse (27°–32° C.) agitated by air sparging for 3 minutes. The foil was then rinsed with dilute acid (10% sulfuric acid by volume) for 1.5 minutes. The clean copper foil was then etched with an aqueous solution containing 5% (v/v) hydrogen peroxide and 15% (v/v) sulfuric acid for 1.5 minutes at 35° C., followed by a 3 minutes of rinsing in warm water (27°–32° C.) with air sparging. 1–2.5 microns of copper was removed from the copper metal surface by the etching procedure. The clean, etched copper foil was then immersed in an alkaline solution of sodium chlorite (i.e., MacDermid MaCuBlack® LT oxide solution) for 5.5 minutes at 75° C. This solution formed a black oxide layer on the copper surface having a weight density of 0.6–0.8 mg/cm$^2$. The black oxide-coated copper foil was then rinsed for 3 minutes in warm water (27°–32° C.) agitated with an air sparger.

The black oxide-coated foil was then immersed in an aqueous solution (pH 12.7) containing 25 gm/L sodium dithionite, 20 gm/L sodium hydroxide, and 0.5 gm/L gelatin in deionized water at a temperature of 40° C. for 6 minutes. Thereafter, the treated copper foil sample was rinsed for 3 minutes in warm water (27°–32° C.) agitated by an air sparger. The sample was then immersed into a salt/acid solution containing 60 gm/L of sodium chloride and 12% hydrochloric acid (by weight) for 1.5 minutes at 21° C. to remove reduction by-products such as amorphous cuprous hydroxide. After this immersion, the reduced copper sample was rinsed in warm water (27°–32° C.) for 1.5 minutes with agitation by an air sparger.

The treated copper foil sample was then immersed in a chromate solution (pH 2.0) containing 2.0 gm/L of chromium trioxide at ambient temperature for 45 seconds. Following chromate treatment, the foil sample was rinsed in warm water (27°–32° C.) for 1 minute, and immersed in an aqueous solution containing 2.0 gm/L potassium permanganate for 45 seconds at 21° C. After permanganate treatment, the copper foil sample was rinsed for 1.5 minutes in warm water (27°–32° C.) and subsequently rinsed for 30 seconds in heated deionized water (49° C.). After this rinse, the sample was dried in a forced air dryer at 107° C. for 10 minutes.

Prior to lamination, the permanganate passivated copper foil sample was baked for 30 minutes at 107° C. As described in Example 2, the treated face of the foil sample was then placed on top of one piece of FR4-impregnated 2113-type fiberglass mat which was stacked on top of three pieces of FR4-impregnated 7628-type fiberglass mat and laminated to construct specimens for coating chemical/mechanical tests.

EXAMPLE 7

SODIUM METABISULFITE/ SODIUM SULFIDE REDUCTION TREATMENT OF AN OXIDIZED COPPER FOIL WITH SILANE PASSIVATING AGENT

A 1 oz/ft$^2$ (0.0014") 5"×5" electrodeposited copper foil was cleaned with an alkaline solution, containing Electrobrite® 402, prepared by dissolving 3 ounces of the powdered chemical per gallon of deionized water, for 7–8 minutes at about 74° C., followed by a warm water (38° C.) rinse and air sparging for 3 minutes. The foil was then rinsed with dilute acid (10% sulfuric acid) for 1–1.5 minutes at 21°–43° C.

The clean copper foil was etched with 4–7.5% hydrogen peroxide in 13–17% sulfuric acid for 1.25–1.35 minutes at 27°–43° C. followed by a water rinse at 27°–43° C. The amount of copper removed from the copper metal surface by this etching procedure was 0.76–2.2 microns. The clean, etched copper foil was then rinsed with water for 1 minute. A black oxide layer was formed by treating the copper surface with an alkaline solution of sodium chlorite (i.e. MacuBlack® LT oxide solution, obtained from MacDermid Inc. of Waterbury, Conn.) for 3.45–4.15 minutes at 74°–80° C. The copper foil containing the black oxide coating was then rinsed with water at 32°–38° C. for about 5.5 minutes. The black oxide coated copper foil was then immersed in an aqueous reducing solution (pH 7.0) containing 50 grams/L sodium metabisulfite, 0.1 grams/L sodium sulfide and 5 grams/L sodium hydroxide for 30 minutes at 77°–80° C. The treated copper foil was then rinsed with deionized water at 32°–38° C., with mechanical agitation. The sample was then immersed, with mechanical agitation, in an aqueous passivating solution (pH 10.3) containing a silane coupling agent, 0.3 to 0.5% by volume, for about 60–120 seconds at 27°–30° C. The coupling agent was γ-aminopropyl-triethoxy silane, $NH_2(CH_2)_3Si(OC_2H_5)_3$. The silyl passivated copper foil was then rinsed with deionized water for 3.0 minutes at 21° C., rinsed again, with deionized water for 30 seconds at 32°–38° C., with mechanical agitation, and forced air dried for 8 to 10 minutes at 107° C. These process steps are outlined in the flow charts of FIGS. 2 and 3 which illustrate the process of the present invention.

Laminate specimens having the passivated copper foil were then prepared. These laminates were then subjected to a variety of stress conditions normally employed in the production of multilayer printed circuit boards. Specimens were subjected independently to solder shock, acid and/or thermal stress followed by peel strength determination as described in Examples 2 to 6. The results of the tests along with the results of tests from laminated specimens prepared by the process of Example 1 are listed in Table 5.

PART A: COMPARATIVE LAMINATE MECHANICAL STRENGTHS BASED ON THE EFFECTS OF TEMPERATURE AND HUMIDITY FOLLOWED BY SOLDER SHOCK

This test was devised to show the relationship between the three laminates and delamination. Laminates were placed in a steam autoclave for one hour at a temperature of about 100° C. and pressure of 20 psi. After cooling to ambient temperature, the laminates were subjected to solder shock by floating or dipping the exposed copper face of the laminates in molten solder (63% lead, 37% tin) at 288° C. for 10, 20 and 30 seconds. After cooling to ambient temperature, the solder shocked laminates were examined for evidence of delamination.

As shown in Table 1 below, laminates prepared in accordance with Example 2 and by conventional black oxide treatment showed satisfactory thermal quality and resistance to moisture absorption. In contrast, laminates prepared in accordance with the sodium dithionite procedure described in U.S. Pat. No. 4,997,516, showed more incidents of delamination under identical shock conditions. These laminates also exhibited the lowest thermal quality and resistance to moisture absorption in comparison to conventional black oxide laminates and laminates having the enhanced bond coating of the present invention.

TABLE 1

Temperature/humidity versus solder shock

| Temp/Humidity (minutes) | Treatment[1] | 10 sec. F[2] | 10 sec. D[3] | 20 Sec. F | 20 Sec. D | 30 Sec. F | 30 Sec. D |
|---|---|---|---|---|---|---|---|
| 30 | black oxide | Pass | Pass | Pass | Pass | Pass | Fail |
|  | x | Pass | Fail | Pass | Fail | Pass | Fail |
|  | y | Pass | Fail | Pass | Pass | Pass | Fail |
| 60 | black oxide | Pass | Pass | Pass | Fail | Pass | Fail |
|  | x | Pass | Fail | Pass | Fail | Fail | Fail |
|  | y | Pass | Pass | Pass | Fail | Pass | Fail |
| 90 | black oxide | Pass | Pass | Pass | Pass | Pass | Fail |
|  | x | Pass | Pass | Pass | Fail | Pass | Fail |
|  | y | Pass | Pass | Pass | Pass | Pass | Fail |
| 120 | black oxide | Pass | Pass | Pass | Pass | Pass | Pass |
|  | x | Pass | Fail | Pass | Fail | Pass | Pass |
|  | y | Pass | Pass | Pass | Fail | Pass | Pass |

[1]x is laminate containing sodium dithionite-treated copper in accordance with U. S. Pat. No. 4,997,516. y is laminates prepared in accordance with Example 2.
[2]"F" stands for float in which the sample was lowered onto the surface of the molten solder and allowed to float for the specified time.
[3]"D" stands for dip, in which the sample is held with tongs and forcibly immersed in molten solder for the specified time. Dipping treatment is more severe than floating.

In the above cases, slightly better peel strength results were obtained with the black oxide laminate compared with the laminate of Example 2. However, the Example 2 laminate performed better than the black oxide laminate in tests described in part (b) below.

PART B: COMPARATIVE LAMINATE PEEL STRENGTHS

This test was devised to show the relationship between three aforementioned laminate samples and peel strengths. The peel strengths of laminates were measured under standard conditions as described in Example 2, after HCL treatment (Example 3), and after a 10 second solder shock treatment (Example 4). The peel strength values of the laminates are described in Table 2 to 4 below. The results demonstrate that laminates prepared in accordance with the invention (Table 4) showed the least amount of reduction in peel strengths, under the aforementioned conditions, in comparison to laminates prepared by conventional black oxide treatment (Table 2) and by the process described in U.S. Pat. No. 4,997,516 (Table 3).

TABLE 2

Peel values of conventional black oxide laminates

| SAMPLE ID | STANDARD PEEL VALUE | HCl peel value | Solder Shock Value |
|---|---|---|---|
| 122009 | 4.9 | 4.0 (−18.9%) | 2.8 (−42.8%) |
| 122004 | 6.6 | 4.2 (−36.3%) | 3.5 (−47.1%) |
| 121908 | 7.1 | 4.8 (−32.9%) | 3.8 (−45.9%) |
| 121906 | 7.4 | 5.8 (−21.6%) | 3.7 (−49.8%) |
| 121904 | 7.5 | 5.5 (−26.6%) | 4.1 (−45.8%) |
| Average Reduction | — | −27.3% | −53.1% |

TABLE 3

Peel value of laminates prepared in accordance with U. S. Pat. No. 4,997,516

| SAMPLE ID | STANDARD PEEL VALUE | HCl peel value | Solder Shock Value |
|---|---|---|---|
| 012804 | 7.3 | 6.1 (−16.4%) | 2.8 (−53.2%) |
| 012808 | 5.5 | 4.7 (−14.5%) | 2.2 (−59.5%) |
| 012802 | 4.5 | 4.1 (−8.8%) | 2.8 (−60.0%) |
| 012803 | 5.8 | 4.5 (−22.4%) | 3.4 (−41.8%) |
| Average Reduction | — | −15.5% | −53.1% |

TABLE 4

Peel values of laminates prepared according to Example 2

| SAMPLE ID | STANDARD PEEL VALUE | HCl peel value | Solder Shock Value |
|---|---|---|---|
| 020709 | 4.4 | 4.2 (−4.5%) | 2.4 (−44.7%) |
| 020712 | 5.1 | 4.9 (−36.3%) | 3.6 (−30.1%) |
| 020712 | 4.5 | 4.3 (−4.4%) | 2.8 (−29.7%) |
| 020713 | 4.1 | 3.7 (−9.7%) | 2.6 (−36.1%) |
| 020711 | 5.7 | 5.3 (−7.0%) | 2.6 (−39.5%) |
| Average Reduction | — | −5.9% | −36.0% |

TABLE 5

Comparison of Laminates prepared in accordance with Example 1 and 7

| Property | Example 1 | Example 7 |
|---|---|---|
| Peel Strength (lb./in.) | 4–5.5 | 5.0–6.5 |
| Pink Ring (drill/HCl dip) | NONE | NONE |
| Peel Strength (after postbake) | 4.0–5.0 | 5.0–6.0 |

TABLE 5-continued

Comparison of Laminates prepared in accordance with Example 1 and 7

| Property | Example 1 | Example 7 |
| --- | --- | --- |
| % Undercut (after HCl) | NONE | NONE |
| Peel Strength (after postbake) | 4.0–5.0 | 5.0–6.0 |
| Torque Test | PASSED | PASSED |
| Delamination (solder float) | >2.0 min. | >2.0 min. |
| Delamination (4 days, 85c/85%rh solder dip) | 20 sec. | 20 sec. |
| Delamination (4 days, 85c/85%rh solder float) | >3.0 min. | >3.0 min. |
| T-260 Delamination | 6.0–7.0 min. | 7.0–8.0 min. |

Many variations of the present invention will suggest themselves to those skilled in the art in light of the above detailed disclosure. All such modifications are within the full intended scope of the appended claims.

What is claimed is:

1. A method for promoting bond adhesion between a copper surface and a resin impregnated substrate comprising the steps of:
   (a) treating a black oxide-coated copper surface with an aqueous reducing solution containing a metabisulfite salt and a sulfide salt to form a treated copper surface;
   (b) treating said treated copper surface to form a passivated copper surface; and
   (c) adhering said passivated copper surface to said substrate.

2. The method according to claim 1 further comprising washing said treated copper surface with a dilute aqueous acid solution prior to step (b).

3. The method according to claim 1 further comprising rinsing said treated copper surface at least once with water prior to step (b).

4. The method according to claim 1 wherein said metabisulfite salt is sodium metabisulfite is present in an amount ranging between about 25 grams and about 100 grams per liter of solution.

5. The method according to claim 4 wherein said metabisulfite salt is sodium metabisulfite and is present in an amount of about 50 grams per liter of solution.

6. The method according to claim 1 wherein said sulfide salt is sodium sulfide and is present in an amount ranging between about 0.08 grams and about 1.0 grams per liter of solution.

7. The method according to claim 6 wherein said sulfide salt is sodium sulfide and is present in an amount of about 0.1 grams per liter of solution.

8. The method according to claim 1 wherein said aqueous reducing solution is adjusted to a pH ranging between about 5.5 and about 8.5.

9. The method according to claim 8 wherein said aqueous reducing solution is adjusted to a pH of about 7.0.

10. The method according to claim 1 wherein step (b) comprises contacting said treated copper surface with a coupling agent.

11. The method according to claim 10 wherein said coupling agent protects said copper surface from oxidation.

12. The method according to claim 10 wherein said coupling agent is selected from the group consisting of γ-aminopropyl-triethoxy silane, aminoalkyl silane solution, vinyltrimethoxysilane, β-(3,4-epoxycyclohexyl) ethyltrimethoxysilane, γ-glycidoxypropyltrimethoxysilane, isocyanato propyl triethyl silane, isopropyl amine, triisostearoyl amine, titanate amine, 2-(N,N-dimethylamino) isobutanol, zirconium IV 2,2-dimethyl 1,3-propanediolo, bis(dioctyl) pyrophosphato-0 (adduct) 2 moles N,N-dimethylamino-alkyl propenoamide, tetraocytl di(ditridecyl)phosphito titanate, tetra(2,2-diallyloxymethyl) butyl-di(ditridecyl)phosphito titanate, neopentyl(diallyl) oxytri(diocytl)pryo-phosphato titante, neopentyl(diallyl)oxy tri(m-amino)phenyl titanate and tetra (2,2 diallyloxymethyl) butyl-di(ditridecyl)phosphito zirconate.

13. The method according to claim 1 wherein step (b) comprises depositing a layer of metal onto said treated copper surface.

14. The method according to claim 13 wherein said metal is selected from the group consisting of nickel, nickel-phosphorus alloy, nickel-boron alloy, and nickel-zinc alloy.

15. The method according to claim 13 wherein said metal layer ranges between about 5 and about 15 microinches thick.

16. The method according to claim 15 wherein said metal layer is about 10 microinches thick.

17. The method according to claim 1 wherein step (b) comprises exposing said treated copper surface to an aqueous solution containing a passivating agent.

18. The method according to claim 10 wherein said coupling agent is selected from the group consisting of γ-aminopropyl-triethoxy silane, vinyltrimethoxysilane, β-(3,4-epoxycyclohexyl) ethyltrimethoxysilane, γ-glycidoxypropyltrimethoxysilane and aminoalkyl silane solution.

19. The method according to claim 18 wherein said coupling agent is γ-aminopropyl-triethoxy silane or aminoalkyl silane solution.

20. The method according to claim 17 wherein said passivating agent is selected from the group consisting of chromium trioxide, sodium tungstate, sodium molybdate, benzotriazole, potassium permanganate, diethylene glycol, lactic acid, citric acid and tellurium chloride.

21. The method according to claim 20 wherein said passivating agent is chromium trioxide.

22. A method for promoting bond adhesion between a copper surface and a resinous polymeric substrate which comprises the steps of:
   (a) treating a black oxide-coated copper surface with an aqueous reducing solution containing sodium metabisulfite and sodium sulfide so as to form a treated copper surface;
   (b) exposing said treated copper surface to a dilute aqueous acid solution so as to form an acid-treated copper surface;
   (c) treating said acid-treated copper surface so as to form a passivated copper surface;
   (d) rinsing said passivated copper surface at least once and thereafter drying said surface so as to form a dried copper surface; and
   (e) adhering said dried copper surface to said resinous polymeric substrate.

23. The method according to claim 22 wherein said acid-treated copper surface is rinsed at least once with water prior to step (c).

24. A method for promoting bond adhesion between a copper surface and a resin impregnated substrate comprising the steps of:
   (a) treating a black oxide-coated copper surface with an aqueous reducing solution containing a metabisulfite salt and a sulfide salt to form a treated copper surface;

(b) treating said treated copper surface so as to form a passivated copper surface; and (c) adhering said passivated copper surface to said substrate.

25. The method according to claim 24 further comprising rinsing said passivated copper surface with water at least once and thereafter drying said surface prior to step (c).

26. The method according to claim 24 wherein said metabisulfite salt is sodium metabisulfite.

27. The method according to claim 24 wherein said sulfide salt is sodium sulfide.

28. A method as claimed in claim 24, wherein said metabisulfite salts and said sulfide salts are each selected from the group consisting of sodium salts, potassium salts and ammonium salts, and combinations thereof.

29. The method according to claim 24 wherein step (b) comprises contacting said treated copper surface with a coupling agent.

30. The method according to claim 24 wherein said coupling agent protects said copper surface from oxidation.

31. The method according to claim 30 wherein said coupling agent is selected from the group consisting of γ-aminopropyl-triethoxy silane, aminoalkyl silane solution, vinyltrimethoxysilane, γ-(3,4-epoxycyclohexyl) ethyltrimethoxysilane, γ-glycidoxypropyltrimethoxysilane.

32. The method according to claim 24 wherein step (b) comprises depositing a layer of metal onto said treated copper surface.

33. The method according to claim 32 wherein said metal is selected from the group consisting of nickel, nickel-phosphorus alloy, nickel-boron alloy, and nickel-zinc alloy.

34. The method according to claim 24 wherein said passivating step (b) comprises exposing said treated copper surface to an aqueous solution containing a passivating agent, and wherein said passivating agent is selected from the group consisting of chromium trioxide, sodium tungstate, sodium molybdate, benzotriazole, potassium permanganate, diethylene glycol, lactic acid, citric acid and tellurium chloride.

35. A method for promoting bond adhesion between a copper surface and a resin impregnated substrate comprising the steps of:

(a) treating a black oxide-coated copper surface with an aqueous reducing solution containing sodium metabisulfite and sodium sulfide to form a treated copper surface;

(b) passivating said treated copper surface so as to form a passivated copper surface; and (c) adhering said passivated copper surface to said substrate.

36. The method according to claim 35 further comprising rinsing said passivated copper surface with water at least once and thereafter drying said surface prior to step (c).

37. A method for treating a black oxide-coated copper surface comprising reducing said surface with an aqueous reducing solution containing a metabisulfite salt and a sulfide salt; and passivating said treated surface with a coupling agent.

38. An aqueous reducing solution for treating a black oxide-coated copper surface comprising sodium metabisulfite and sodium sulfide wherein said sodium metabisulfite is present in a concentration between about 25 gm/L and about 100 gm/L and said sodium sulfide is present in a concentration between about 0.08 gm/L and about 1.0 gm/L.

39. The aqueous reducing solution according to claim 38 comprising sodium metabisulfite and sodium sulfide wherein said sodium metabisulfite is present at a concentration of about 50 gm/L and said sodium sulfide is present at a concentration of 0.1 gm/L.

* * * * *